(12) United States Patent
Takeno

(10) Patent No.: US 7,229,501 B2
(45) Date of Patent: Jun. 12, 2007

(54) SILICON EPITAXIAL WAFER AND PROCESS FOR MANUFACTURING THE SAME

(75) Inventor: Hiroshi Takeno, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 220 days.

(21) Appl. No.: 10/501,672

(22) PCT Filed: Jan. 17, 2003

(86) PCT No.: PCT/JP03/00345

§ 371 (c)(1),
(2), (4) Date: Jul. 16, 2004

(87) PCT Pub. No.: WO03/065439

PCT Pub. Date: Aug. 7, 2003

(65) Prior Publication Data

US 2005/0087830 A1    Apr. 28, 2005

(30) Foreign Application Priority Data

Jan. 25, 2002    (JP)    ............... 2002-016663

(51) Int. Cl.
*C30B 25/12*    (2006.01)

(52) U.S. Cl. .............. 117/95; 117/89; 117/92; 117/93

(58) Field of Classification Search ............ 117/89, 117/92, 93, 95
See application file for complete search history.

(56) References Cited

U.S. PATENT DOCUMENTS 6,206,961 B1    3/2001    Takeno et al. .............. 117/20
6,641,888 B2 *  11/2003   Asayama et al. ........... 428/64.1
6,878,451 B2 *  4/2005    Asayama et al. ........... 428/446
2001/0006039 A1  7/2001   Cho et al. ................... 117/13

FOREIGN PATENT DOCUMENTS

| EP | 0 917 192 | 5/1999 |
|---|---|---|
| EP | 1 069 214 | 1/2001 |
| JP | 10-270455 | 10/1998 |
| JP | 11-21200 | 1/1999 |
| JP | 11-147789 | 6/1999 |
| JP | 2000-219598 | 8/2000 |
| JP | 2001-210650 | 8/2001 |
| JP | 2001-237247 | 8/2001 |
| JP | 2001-274167 | 10/2001 |
| WO | 00/46433 | 8/2000 |

* cited by examiner

*Primary Examiner*—Felisa Hiteshew
(74) *Attorney, Agent, or Firm*—Wenderoth, Lind & Ponack, L.L.P.

(57) ABSTRACT

The present invention provides a silicon epitaxial wafer having an excellent IG capability all over the radial direction thereof and a process for manufacturing the same. The present invention is directed to a silicon epitaxial wafer having an excellent gettering capability all over the radial direction thereof, wherein density of oxide precipitates detectable in the interior of a silicon single crystal substrate after epitaxial growth is $1 \times 10^9/cm^3$ or higher at any position in the radial direction.

4 Claims, 2 Drawing Sheets

SILICON EPITAXIAL WAFER AND PROCESS FOR MANUFACTURING THE SAME

This application is a 371 of PCT/JP03/00345 Jan. 17, 2003.

TECHNICAL FIELD

The present invention relates to a silicon epitaxial wafer having an excellent gettering capability all over the surface thereof and a process for manufacturing the same.

BACKGROUND ART

Most of silicon wafers widely used as substrates to fabricate semiconductor devices have been manufactured from a silicon single crystal grown by a Czochralski (CZ) method. In the silicon single crystal grown by the CZ method, interstitial oxygen is contained at a concentration of about $10^{18}$ atoms/cm$^3$ as an impurity. The interstitial oxygen precipitates due to supersaturation in the course of a thermal history from solidification in crystal growth till cooling to room temperature (hereinafter also abbreviated to a crystal thermal history) and in a heat treatment of a fabrication process for a semiconductor device, thereby a precipitate of silicon oxide (hereinafter also referred to as an oxide precipitate or simply a precipitate) being formed.

The oxide precipitate, works effectively as a site where a heavy metal impurity mixed into a crystal during a device process is captured (Internal Gettering: IG) to improve device characteristics and a product yield. Therefore, an IG capability is attached importance to as one of properties of a silicon wafer.

A process of oxygen precipitation consists of formation of a precipitation nucleus and its growth. Usually formation of a precipitation nucleus progresses in a crystal thermal history and thereafter the precipitation nucleus grows large in a heat treatment such as a device process to be detected as an oxide precipitate. Hence a precipitate formed in a crystal thermal history is herein called a Grown-in precipitation nucleus. As a matter of course, a case arises where an oxygen precipitation nucleus is also formed in a subsequent heat treatment.

In the case of a usual as-grown wafer, an oxygen precipitation nucleus present at a stage prior to a device process is very small in size and therefore has no IG capability. However, through the device process, the oxygen precipitation nucleus grows to a large oxide precipitate having an IG capability.

In order to make a device fabricating region in the vicinity of a surface of the wafer defect-free, a case exists where there is used an epitaxial wafer obtained by depositing silicon single crystals on a substrate in vapor phase growth. In this epitaxial wafer as well, it is important to impart an IG capability to the substrate.

Since an epitaxial step is carried out at a high temperature of about 1100° C. or higher, almost all of oxygen precipitation nuclei (Grown-in precipitation nuclei) formed in a crystal thermal history are annihilated with the result that no oxygen precipitate is formed in a subsequent device process. Therefore, there has remained a problem to reduce an IG capability of an epitaxial wafer.

As a resort to solve this problem, a process has been available in which a substrate prior to an epitaxial step is subjected to a heat treatment at a temperature of the order of 800° C. to thereby grow Grown-in precipitation nuclei formed in a crystal thermal history to sizes which are not annihilated even in an epitaxial step at high temperature. In this process, in a case where a temperature in a heat treatment prior to epitaxial growth is 800° C., for example, Grown-in precipitation nuclei with sizes equal to or larger than a critical size at 800° C. (the minimum size of a precipitation nucleus capable of stable growth at the temperature) grow and survive in the epitaxial step, and further grow in a heat treatment such as a device process following the epitaxial step into oxide precipitates.

Surface distribution in density of Grown-in precipitation nuclei in a substrate prior to an epitaxial step is not necessarily uniform. As a typical example, a case arises where there exist, in the form of a ring, Grown-in precipitation nuclei with comparatively large sizes serving as nuclei of oxidation induced stacking faults (hereinafter also referred to as OSF) to be generated after a heat treatment at a temperature equal to or higher than about 1100° C. in an oxidizing atmosphere (hereinafter a region where OSF are generated in the form of a ring is also referred to as an OSF ring). If such a substrate is subjected to a heat treatment to grow Grown-in precipitation nuclei and then epitaxial growth is carried out, surface distribution in density of precipitates in an epitaxial wafer becomes non-uniform, leading to a problem of non-uniformity in an IG capability.

It has been known that in a general p$^+$ type substrate doped with boron at a high concentration, an OSF ring occurs more easily under an influence of the doped boron as compared with a p type substrate doped with boron at a low concentration.

Therefore, the problem of non-uniformity of an IG capability in a surface of the substrate as described above easily arises especially in a p/p$^+$ type epitaxial wafer using a p$^+$ type substrate. Needless to say, there are some cases where an OSF ring occurs, in addition to a p$^+$ type substrate, on a p type substrate, an n type substrate doped with phosphorus at a low concentration and an n$^+$ type substrate doped with antimony or arsenic at a high concentration, all being used as a substrate for an epitaxial wafer, according to crystal growth conditions. In such cases, a problem of non-uniformity in an IG capability arises as in the case of a p$^+$ type substrate.

A device process in recent years has progressed toward lower temperature and shorter time with the use of a larger diameter wafer. For example, a series of device processes are all carried out at a temperature of 1000° C. or lower, and RTP (Rapid Thermal Processing) is frequently used that requires a heat treatment only for a time of the order of tens of seconds. In such a device process, since there is a case where the sum of the total heat treatments corresponds to only a heat treatment of the order of 2 hours at 1000° C., there cannot be expected growth of oxide precipitates during the device process, which was realized in the prior practice. For such a reason, in a device process carried out at low temperature for a short time, a necessity arises for imparting an excellent IG capability to a wafer prior to a device process.

DISCLOSURE OF THE INVENTION

The present invention has been made in light of the above problems, and it is an object of the present invention to provide a silicon epitaxial wafer having an excellent IG capability in the entire substrate thereof and a process for manufacturing the wafer.

In order to achieve the above object, in a silicon epitaxial wafer according to the present invention, density of oxide precipitates detectable in the interior of a silicon single crystal substrate after epitaxial growth is $1\times10^9/cm^3$ or higher at any position in the radial direction of the wafer.

Thus, the presence of oxide precipitates of high density at any position in the radial direction of the wafer leads to an epitaxial wafer having an excellent IG capability in the entire substrate.

Furthermore, with oxide precipitates empirically detectable at high density in an epitaxial wafer immediately after an epitaxial step, the epitaxial wafer has an excellent IG capability at a stage prior to a device process and is especially effective for a device process at low temperature for a short time in which no growth of oxide precipitates can be expected. Here, a critical size of an oxide precipitate having an IG capability is set as a practical guide to a size of an oxide precipitate empirically detectable (on the order of a value in the range from 30 to 40 nm in diameter). In general, even an oxide precipitate of a size empirically undetectable is considered as having an IG capability, and hence judgment can be justified that a size empirically detectable has a sufficient IG capability.

As the silicon single crystal substrate prior to the epitaxial growth, there is preferably used a silicon wafer which has Grown-in precipitation nuclei formed in a growth step for silicon single crystal, and in which stacking faults in the form of a ring are not generated in a heat treatment in an oxidizing atmosphere.

The inventor has found that when epitaxial growth is carried out on a substrate having an OSF ring after the substrate has been heat treated for growing Grown-in precipitation nuclei, density of oxide precipitates detectable is non-uniform in the radial direction of an epitaxial wafer with decreased density of precipitates in a partial region thereof, which leads to the present invention. That is, with a substrate having no OSF ring, since distribution in the radial direction in density of Grown-in precipitation nuclei is comparatively uniform, oxide precipitates at high density can be formed uniformly in the entire substrate. For a general $p^+$ type substrate doped with boron at a high concentration, the present invention is especially effective because an OSF ring is generated with ease under the influence of the doped boron.

In the present invention, the term "boron at high concentration" means that the boron concentration is at least $5\times10^{17}$ atoms/$cm^3$ and when an intentionally doped dopant to control resistivity is only boron, the concentration corresponds to resistivity of 0.1 Ω·cm or lower.

In order to obtain density of oxide precipitates at $1\times10^9/cm^3$ or higher at any position in the radial direction of an epitaxial wafer, there is used as a substrate a silicon single crystal wafer which has Grown-in precipitation nuclei formed in a growth step of a silicon single crystal, and in which stacking faults in the form of a ring are not generated in a heat treatment in an oxidizing atmosphere, the substrate being heat treated for growing Grown-in precipitation nuclei, followed by epitaxial growth.

Thus, since in a substrate having no OSF ring, distribution in the radial direction in density of Grown-in precipitation nuclei is almost uniform, if the substrate is heat treated for growing Grown-in precipitation nuclei and then epitaxial growth is performed thereon, oxide precipitates at high density can be obtained at any position in the radial direction of the wafer. While no specific limitation is imposed on the upper limit of oxide precipitate density, a case occurs where the strength of a wafer is reduced due to decreased oxygen concentration in solid solution, so the upper limit is preferably $1\times10^{12}/cm^3$ or lower.

A substrate without an OSF ring described above can be obtained using a known technique in which a single crystal is pulled under control of a ratio V/G of a pulling rate V of a crystal to a temperature gradient G in the vicinity of a solid liquid interface in a pulled crystal, as described in, for example, JP A 99(H11)-147786 and JP A 99(H11)-157996 and others. It has been known that in the case of high concentration boron-doping, a V/G value at which an OSF ring occurs shifts to the higher V/G side (E. Dornberger et al. J. Crystal Growth 180(1977) 343-352.). Therefore, even if a single crystal is pulled in the same condition as a condition (V/G value) for pulling in which no OSF ring occurs in the case of a low concentration boron-doped substrate (a p type substrate), in the case of a high concentration boron-doped substrate, an OSF ring occurs depending on a boron concentration thereof. That is, in the case of a general $p^+$ type substrate doped with boron at high concentration, an OSF ring occurs mostly by an effect of doped boron; therefore, the manufacturing process according to the present invention is especially effective.

A position of an OSF ring shifts toward the outer surface of a single crystal with increase in a V/G value as shown in FIG. 4. Therefore, in order to obtain a substrate in which no OSF ring occurs, a V/G value should be increased so as to annihilate an OSF ring in a peripheral portion of the crystal. Furthermore, even if an OSF ring is present in a peripheral portion in a state of an as-grown crystal, by removing the OSF ring region in a subsequent processing step of a substrate, the the substrate having no OSF ring can be obtained.

As stated above, in the case of a $p^+$ type substrate, a position of an OSF ring on a wafer surface depends on a V/G value and a boron concentration. Based on this knowledge, by controlling a V/G value and a boron concentration a substrate having no OSF ring can be obtained.

While no specific limitation is imposed on the lower limit of resistivity as a substrate for a $p/p^+$ type epitaxial wafer, a boron concentration may be controlled to about 0.014 Ω·cm or higher as a practical crystal pulling condition. However, as one effect of a $p^+$ type substrate for a $p/p^+$ type epitaxial wafer, there is an effect of improving a resistance to latch-up in a device, and hence resistivity of the substrate is necessary to be about 0.1 Ω·cm or lower to obtain the effect, preferably 0.05 Ω cm or lower, and most preferably 0.02 Ω·cm or lower to ensure the sufficient effect.

On the other hand, with higher resistivity of a substrate, there are obtained an effect of difficulty in generating an OSF ring and in addition thereto an additional effect of no necessity for forming an oxide film on a back surface of a wafer used for preventing a change in resistivity of an epitaxial layer due to auto-doping. While any conditions for a heat treatment for growing Grown-in precipitation nuclei may be adopted as far as Grown-in precipitation nuclei can grow to a size equal to or larger than a value empirically detectable after epitaxial growth, there may be employed such conditions as about 1000° C. or higher and about 0.5 hr or longer. Accordingly, an excellent IG capability can be added all over the radial direction of the wafer at a stage prior to a device process.

From the above description, according to the present invention, there can be obtained a silicon epitaxial wafer having an excellent gettering capability all over the radial direction of the wafer.

BEST MODE FOR CARRYING OUT THE INVENTION

Description will be given of an embodiment of a process for manufacturing a silicon epitaxial wafer of the present invention below with reference to the accompanying drawings and it is needless to say that the embodiments are shown by way of illustration and various modifications or variations thereof can be implemented as far as not departing from the technical concept of the present invention.

Figure 1:
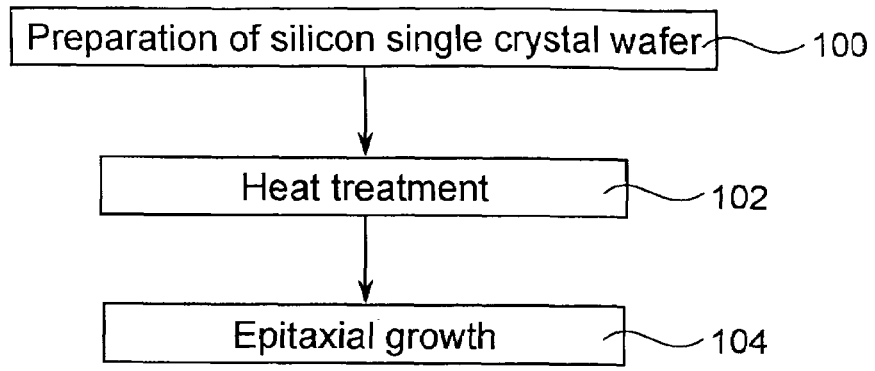
FIG. 1 is a flow chart showing an example of a step sequence of a process for manufacturing a silicon epitaxial wafer according to the present invention.

FIG. 1 is a flow chart showing an example of a step sequence of a process for manufacturing a silicon epitaxial wafer according to the present invention.

As shown in FIG. 1, in the first place there is prepared a silicon single crystal wafer serving as a substrate of an epitaxial wafer (step 100). The substrate contains no OSF ring due to control of a V/G value and a boron concentration. The substrate is subjected to a heat treatment to grow oxide precipitates prior to an epitaxial step (step 102).

Here, any conditions for the heat treatment may be adopted as far as Grown-in precipitation nuclei can grow to a size equal to or larger than a value detectable after an epitaxial step. For example, there may be performed a heat treatment where the temperature is raised from 800° C. to 1000° C. at a rate of 3° C./min and then kept at 1000° C. for 4 hrs. By performing the heat treatment prior to an epitaxial step, large-sized oxide precipitates having an IG capability can be formed at high density in the substrate. Next, when required, the wafer is cleaned, an oxide film thereon is removed and other steps are carried out, thereafter epitaxial growth being performed (step 104).

The above heat treatment may be performed either before or after mirror polishing (also referred to as a mechanical chemical polishing) of the wafer to be heat treated. When the heat treatment is performed before the mirror polishing, the mirror polishing is carried out after the heat treatment and then the epitaxial growth follows.

A silicon epitaxial wafer according to the present invention is characterized in that density of oxide precipitates detectable in the interior of a substrate after epitaxial growth is $1\times10^9/cm^3$ or higher at any position in the radial direction of the epitaxial wafer. Thus, with the presence of oxide precipitates at high density in any position in the radial direction of the wafer, the epitaxial wafer has an excellent IG capability all over the radial direction.

Furthermore, with oxide precipitates empirically detectable at high density after the epitaxial step, an epitaxial wafer has an excellent IG capability at a stage prior to a device process and is especially effective for a device process at a low temperature for a short time in which no growth of oxide precipitates can be expected.

As a substrate for growing an epitaxial layer, it is effective to use a silicon single crystal wafer having Grown-in precipitation nuclei formed in a growth step of the silicon single crystal and in which stacking faults in the form of a ring are not generated in a heat treatment in an oxidizing atmosphere. Since a substrate having no OSF ring has distribution in the radial direction in density of Grown-in precipitates is comparatively uniform, oxide precipitates at high density can be formed all over the radial direction of the wafer.

Confirmation whether an OSF ring is present or not in a substrate may be conducted such that the substrate is heat treated at 1150° C. for 60 min in an oxidizing atmosphere, and is subjected to chemically selective etching, followed by observation on a surface thereof with an optical microscope.

Since in a general $p^+$ type substrate doped with boron at a high concentration an OSF ring occurs with ease due to an influence of doped boron, application of the construction according to the present invention is especially effective.

EXAMPLES

Description will be given of the present invention showing an example in a more concrete manner, but it is needless to say that the example is presented by way of illustration and not to be construed by way of limitation.

Example 1

Mirror-finished substrates were prepared from different two positions (which are positions grown in the former half and the latter half, respectively, in a crystal growth step and hereinafter referred to as a crystal position A and a crystal position B) of a boron-doped silicon single crystal having a diameter of 8 inches, a plane orientation of <100>, and resistivity in the range of from about 0.015 to about 0.018 Ω·cm grown by the CZ method. An oxygen concentration of the substrates which was measured using a gas fusion method was about 14 ppma.

In pulling of the crystal, a V/G value was adjusted such that an OSF ring is annihilated toward the outer periphery thereof.

Then, the substrate was subjected to a heat treatment in an oxidizing atmosphere prior to an epitaxial step. That is, the substrate was loaded into a heat treatment furnace at 800° C., the temperature was raised from 800° C. to 1000° C. at a rate of 3° C./min and the substrate was kept at 1000° C. for 4 hrs. After keeping the temperature, the temperature in the heat treatment furnace was lowered to 800° C. at a rate of 3° C./min and then the substrate was unloaded out of the furnace. Then, oxide films on surfaces of the substrate were removed with hydrogen fluoride aqueous solution, and thereafter epitaxial growth was carried out at about 1100° C. to deposit a silicon single crystal layer to a thickness of about 5 μm, with the result that an epitaxial wafer was obtained.

The epitaxial wafers which are not subjected to any heat treatment were measured on density of oxide precipitates in the interior of the substrate using an infrared scattering tomography method (hereinafter also referred to as LST), which is one of infrared scattering methods. With LST, there is detectable an oxide precipitate of a size equal to or larger than a diameter of the order of 40 nm. Positions at which precipitate density was measured were in the depth direction in the range of 50 to 230 μm from the surface of the substrate and in the radial direction the position of 5 mm inwardly from the periphery, and positions at 10 mm spacing between 90 mm and 10 mm inwardly from the periphery.

Figure 2:
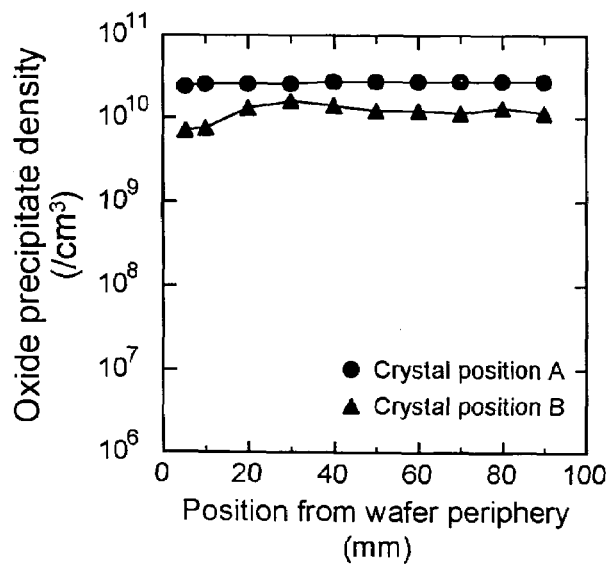
FIG. 2 is a graph showing distribution in the radial direction of the wafer in density of precipitates in a crystal position A and a crystal position B of Example 1.

FIG. 2 is a graph showing distribution in the radial direction in density of precipitates in a crystal position A and a crystal position B of Example 1. In either of the crystal positions, it is found that the precipitate density all over the radial direction of the epitaxial wafer is $1\times10^9/cm^3$ or higher and distribution the radial direction thereof is almost uniform.

Furthermore, the prepared substrate was subjected to a heat treatment at 1150° C. for 100 min in an oxidizing atmosphere without performing a heat treatment prior to an epitaxial step and epitaxial growth thereon. Then, chemically selective etching was carried out on the substrate and thereafter observation was conducted on a surface of the substrate with an optical microscope for confirmation of the presence or absence of an OSF ring. As a result, no OSF was observed.

Comparative Example 1

Mirror-finished substrates were prepared from different two positions (which are positions grown in the former half and the latter half, respectively, in a crystal growth step and hereinafter referred to as a crystal position A and a crystal position B) of a boron-doped silicon single crystal having a diameter of 8 inches, a plane orientation of <100>, and resistivity in the range of from about 0.010 to about 0.013 Ω·cm grown at a pulling speed lower than in Example 1 using a pulling apparatus having the same furnace construction (the same G) as in Example 1. An oxygen concentration of substrates was about 13 ppma.

Then, the substrate was subjected to a heat treatment in an oxidizing atmosphere prior to an epitaxial step in a similar manner to Example 1. That is, the substrate was loaded into a heat treatment furnace at 800° C., the temperature was raised from 800° C. to 1000° C. at a rate of 3° C./min and the substrate was kept at 1000° C. for 4 hrs. After keeping the temperature, the temperature in the heat treatment furnace was lowered to 800° C. at a rate of 3° C./min and then the substrate was unloaded out of the heat treatment furnace. Then, oxide films on surfaces of the substrate were removed with hydrogen fluoride aqueous solution, and thereafter epitaxial growth was carried out at about 1100° C. to deposit a silicon single crystal layer to a thickness of about 5 µm, with the result that an epitaxial wafer was obtained.

The epitaxial wafers which are not subjected to any heat treatment were measured on density of oxide precipitates in the interior of the substrate using LST. Positions at which precipitate density was measured were in the depth direction at a position in the range of 50 to 230 µm from the surface of the substrate and in the radial direction the position of 5 mm inwardly from the periphery, and positions at 10 mm spacing between 90 mm and 10 mm inwardly from the periphery.

Figure 3:
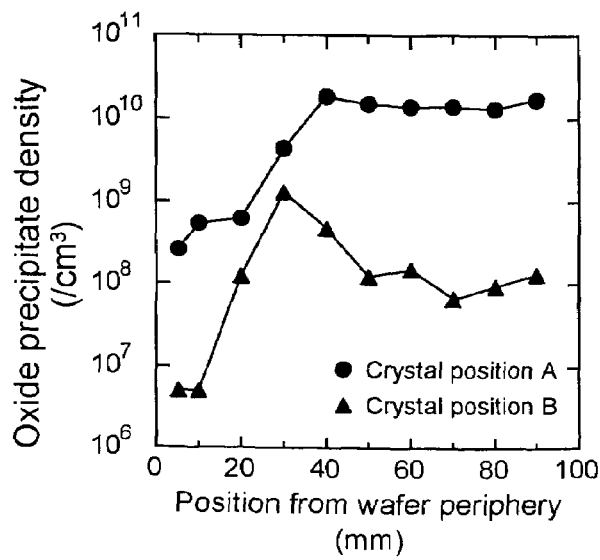
FIG. 3 is a graph showing distribution in the radial direction of the wafer in density of precipitates in a crystal position A and a crystal position B of Comparative Example 1.
Figure 4:
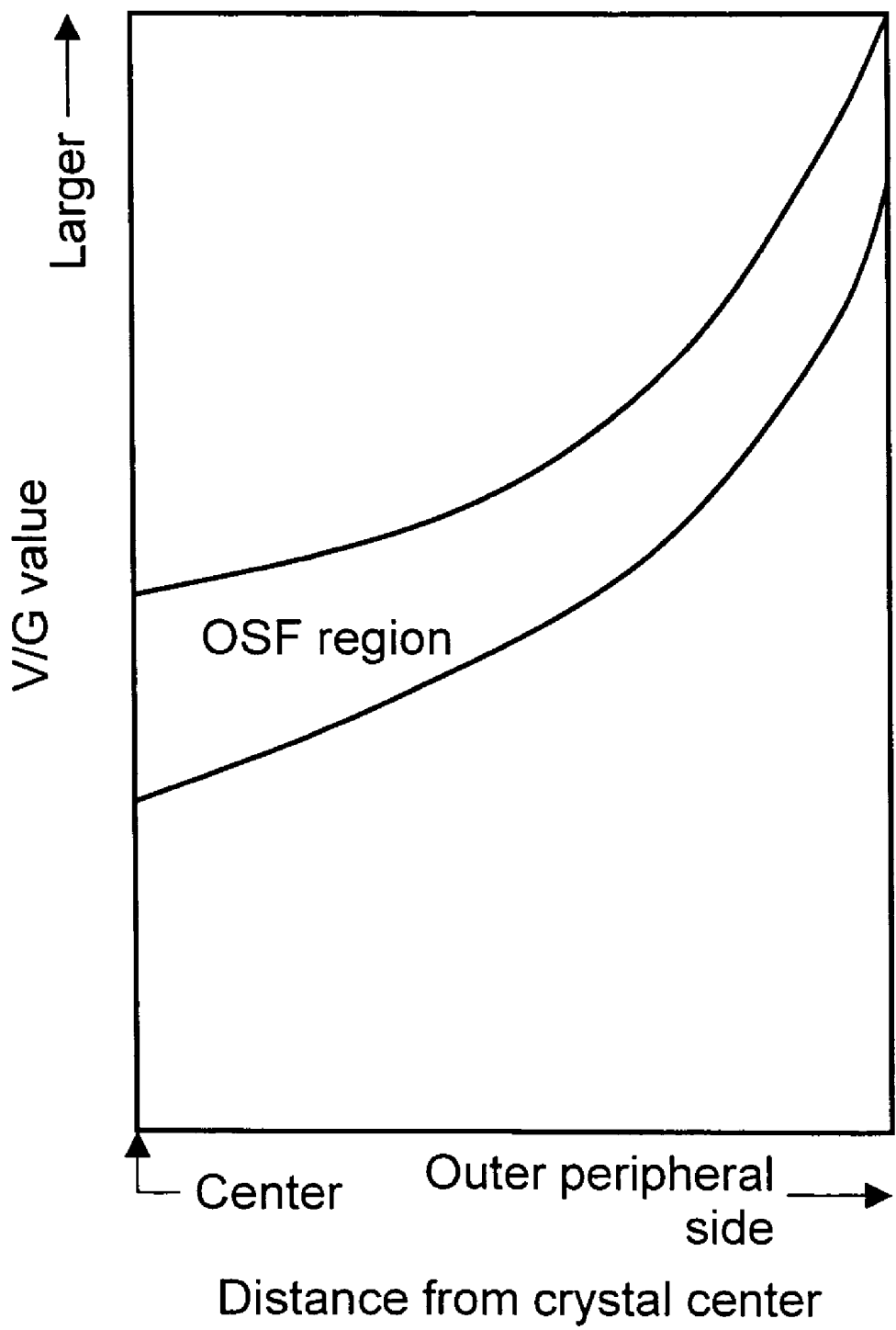
FIG. 4 is a graph showing an OSF region in relation to a crystal position and a V/G value.

FIG. 3 is a graph showing distribution in the radial direction in density of precipitates in a crystal position A and a crystal position B. In the case of the crystal position A, precipitate density was lower in a region up to about 20 mm inwardly from the wafer periphery. Furthermore, in the case of the crystal position B, precipitate density was lower in a region up to about 20 mm inwardly from the wafer periphery and a region from 50 mm inwardly from the wafer periphery to the center. That is, in either cases, the distribution in the radial direction in the precipitate density was very non-uniform.

Furthermore, the prepared substrate was subjected to a heat treatment at 1150° C. for 100 min in an oxidizing atmosphere without performing a heat treatment prior to an epitaxial step and epitaxial growth thereon. Then, chemically selective etching was carried out on the substrate and thereafter observation was conducted on a surface of the substrate with an optical microscope for confirmation of the presence or absence of an OSF ring. As a result, in either cases of both crystal positions A and B, an OSF ring was observed at a position of about 30 mm inwardly from the periphery of the substrate. From the results, it was confirmed that in a case where a substrate in which an OSF ring is present is used the distribution in the radial direction in the precipitate density after the epitaxial step is non-uniform and the precipitate density is lower in a partial region in the radial direction thereof.

Note that the present invention is not limited to the above embodiments.

The above embodiments are intended to describe the present invention by way of illustration and any epitaxial wafer and any manufacturing process having substantially the same construction as that of the technical concept described in appended claims of the present invention and exerting functions and results similar to the technical concept is included in the technical scope of the present invention.

For example, in the above Example, description is given of the case where the silicon single crystal having a diameter of 200 mm (8 inches) is grown, the present invention is not limited to this, but can be applied to silicon single crystals having diameters in the range of from 100 to 400 mm (4 to 16 inches) or more.

Besides, needless to say, the present invention is also applied to a so-called MCZ method in which there is applied to silicon melt a horizontal magnetic field, a vertical magnetic field, a cusp magnetic field or the like.

Capability of Exploitation in Industry:

As described above, according to the present invention, a substrate having no OSF ring is subjected to a heat treatment prior to an epitaxial step and thereafter epitaxial growth is performed thereon; thereby there is provided an epitaxial wafer having an excellent IG capability all over the radial direction thereof.

The invention of claimed is:

1. A silicon epitaxial wafer, comprising a silicon single crystal substrate and an epitaxial layer grown on a surface of the silicon single crystal substrate, wherein the silicon single crystal substrate after epitaxial growth has a density of oxide precipitates which are detectable in the interior of the silicon single crystal substrate of $1 \times 10^9/cm^3$ or higher at any position in the radial direction, and wherein the silicon single crystal substrate prior to epitaxial growth is heat treated in an oxidizing atmosphere so that Grown-in precipitation nuclei are grown in the silicon single crystal but stacking faults in the form of a ring are not generated in the silicon single crystal substrate.

2. The silicon epitaxial wafer according to claim 1, wherein the silicon single crystal substrate prior to the epitaxial growth is a boron-doped substrate having resistivity of 0.1 Ω·cm or lower.

3. A process for manufacturing a silicon epitaxial wafer comprising the steps of:
    heat treating a silicon single crystal substrate in an oxidizing atmosphere to grow Grown-in precipitation nuclei in the silicon single crystal substrate; and thereafter,
    performing epitaxial growth on the substrate,
    wherein stacking faults in the form of a ring are not generated in the silicon single crystal substrate during the heat treatment.

4. The process for manufacturing a silicon epitaxial wafer according to claim 3 wherein the substrate is a boron-doped substrate having resistivity of 0.1 Ω·cm or lower.

* * * * *